(12) United States Patent
Parrish et al.

(10) Patent No.: US 7,541,819 B2
(45) Date of Patent: Jun. 2, 2009

(54) MODULARIZED DEVICE INTERFACE WITH GROUNDING INSERT BETWEEN TWO STRIPS

(75) Inventors: Frank B. Parrish, Simi Valley, CA (US); Brian Brecht, Newbury Park, CA (US); Derek Castellano, Simi Valley, CA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/261,962

(22) Filed: Oct. 28, 2005

(65) Prior Publication Data

US 2007/0096755 A1    May 3, 2007

(51) Int. Cl.
*G01R 31/02* (2006.01)
(52) U.S. Cl. ..................................................... 324/754
(58) Field of Classification Search .................. None
See application file for complete search history.

(56) References Cited

U.S. PATENT DOCUMENTS

| | | | | |
|---|---|---|---|---|
| 3,560,907 A | * | 2/1971 | Heller | ......................... 439/626 |
| 3,611,128 A | * | 10/1971 | Nagata | ...................... 324/72.5 |
| 4,045,737 A | * | 8/1977 | Coberly | ...................... 324/754 |
| 4,161,692 A | | 7/1979 | Tarzwell | |
| 4,922,191 A | * | 5/1990 | Conover | ...................... 324/755 |
| 5,386,346 A | * | 1/1995 | Gleadall | ...................... 361/799 |
| 5,480,721 A | | 1/1996 | Pozzoli et al. | |
| 5,821,764 A | | 10/1998 | Slocum et al. | |
| 5,973,504 A | | 10/1999 | Chong | |
| 6,091,256 A | | 7/2000 | Long et al. | |
| 6,166,553 A | | 12/2000 | Sinsheimer | |
| 6,292,005 B1 | | 9/2001 | Suga | |
| 6,348,810 B1 | | 2/2002 | Yanagawa et al. | |
| 6,420,888 B1 | | 7/2002 | Griffin et al. | |
| 6,489,795 B1 | * | 12/2002 | Klele et al. | .................. 324/762 |
| 6,617,867 B2 | * | 9/2003 | Bruno et al. | ................. 324/758 |
| 6,642,729 B2 | | 11/2003 | Kang et al. | |
| 6,972,578 B2 | | 12/2005 | Martens et al. | |
| 6,984,974 B2 | * | 1/2006 | Liken et al. | ............... 324/158.1 |
| 6,995,578 B2 | * | 2/2006 | Shibuya et al. | ............... 324/754 |
| 7,147,499 B1 | | 12/2006 | Mayder et al. | |

(Continued)

FOREIGN PATENT DOCUMENTS

EP        1 584 934 A1    10/2005

(Continued)

OTHER PUBLICATIONS

PCT International Search Report (PCT/US2006/041965); Feb. 13, 2007; pp. 1-3.

*Primary Examiner*—Paresh Patel
(74) *Attorney, Agent, or Firm*—Foley & Lardner LLP; Joseph M. Maraia; Ralph Trementozzi

(57) ABSTRACT

The traditional device interface board is replaced by a number of smaller strips containing one or more electrical components for interfacing the device under test and the test head. The device interface modules may mount to a stiffening member having a back bone and multiple ribs running through the stiffening member. The device interface strips can create a lattice-like structure for the interface circuitry. Individual circuits may be disposed on the interface strips to perform functionality relating to the device under test and/or the test head.

14 Claims, 5 Drawing Sheets

U.S. PATENT DOCUMENTS

| | | |
|---|---|---|
| 7,148,714 B2 | 12/2006 | Tervo et al. |
| 7,230,437 B2 | 6/2007 | Eldridge et al. |
| 7,233,599 B2 * | 6/2007 | Deas et al. .................. 370/420 |
| 7,262,611 B2 | 8/2007 | Mathieu et al. |
| 2002/0063566 A1 | 5/2002 | Bruno et al. |
| 2002/0167328 A1 | 11/2002 | Kister |
| 2003/0027423 A1 | 2/2003 | Zhou et al. |
| 2003/0077932 A1 * | 4/2003 | Lewinnek ................... 439/246 |
| 2006/0006892 A1 * | 1/2006 | Green et al. ................. 324/755 |
| 2007/0096756 A1 | 5/2007 | Parrish et al. |

FOREIGN PATENT DOCUMENTS

| | | |
|---|---|---|
| JP | 2002 222839 | 8/2002 |
| JP | 2002222839 A * | 8/2002 |
| JP | 2005 017121 | 1/2005 |
| WO | WO 2006/060467 | 6/2006 |

* cited by examiner

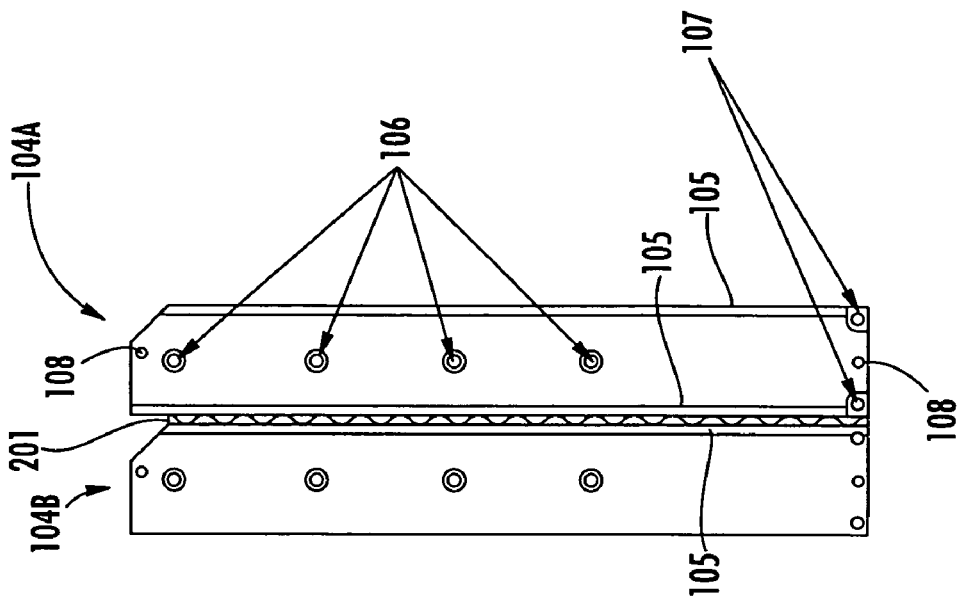
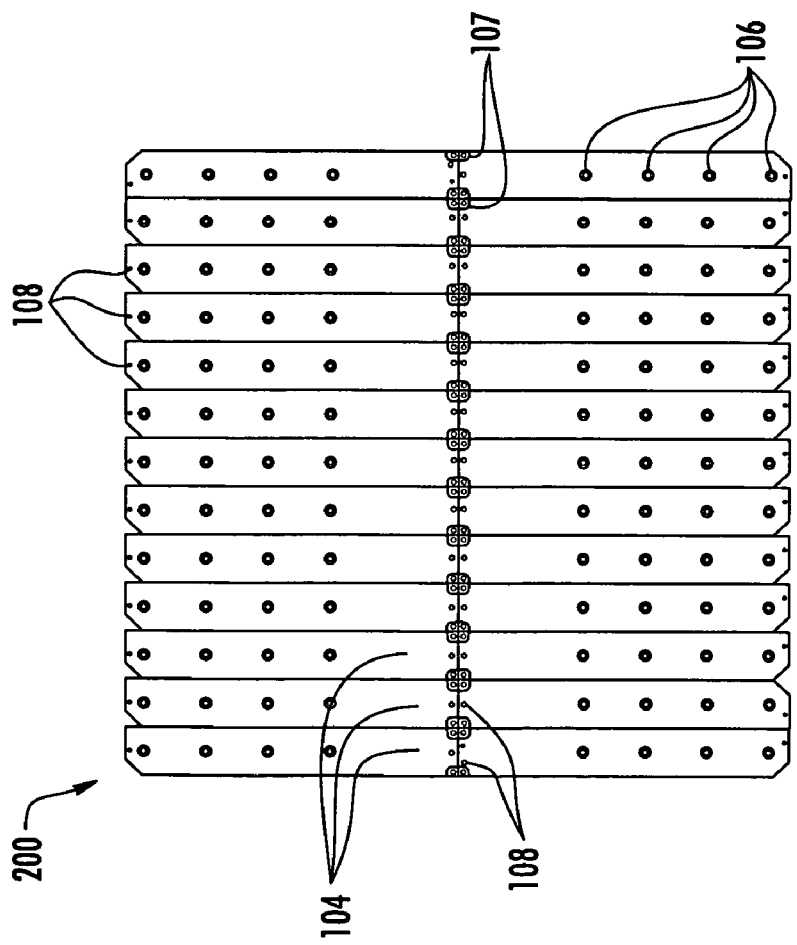
FIG. 2B
FIG. 2A

MODULARIZED DEVICE INTERFACE WITH GROUNDING INSERT BETWEEN TWO STRIPS

FIELD OF THE INVENTION

The present invention relates to automated testing equipment, more specifically a device interface board and method for automatic test equipment.

BACKGROUND OF THE INVENTION

Automatic test equipment ("ATE") has been known in the art for several years. Automating the testing procedures for circuit boards and electronic devices expedites the testing process and allows for greater production of tested electronic devices. When testing an instrument, an interface assembly is docked to a test head using methods well known in the art. The interface assembly contains a device interface board ("DIB") attached to a stiffening member. An instrument interface block makes an electrical connection to the DIB. The DIB is a printed circuit board ("PCB") that is pre-designed and manufactured specifically for the instrument to be tested and the test that is to be run.

For every configuration and every instrument to be tested, a unique DIB is needed with circuitry unique to that configuration or instrument and device to be tested. The requirement of producing new boards for every configuration drastically increases the cost of testing and developing electrical devices. The development of a DIB requires a great amount of time and energy into the design, manufacture, and testing of the board itself. The replacement of the DIB in the probe interface during testing is also time consuming.

SUMMARY OF THE INVENTION

Various embodiments of the present invention provide for a modularized device and method for automatic testing equipment ("ATE"). The traditional device interface board ("DIB") is replaced by a number of smaller strips containing circuitry networks for interfacing the instrument interface block and the test head. An example of the present invention modularizes the DIB and its connections, providing for the easy reconfiguration of testing instruments without the cost of creating entirely new DIB boards for every instrument or test configuration. The device interface modules, or strips, mount to a stiffening member having a back bone and multiple ribs running through the stiffening member. The backbone bisects the length of the stiffening member; the ribs run parallel to the backbone. The device interface strips mount to the backbone extending perpendicularly across the ribs creating a lattice-like structure for the interface circuitry. Individual circuits are disposed on the interface strips to lie between mounting points on the strips and the backbone and ribs of the stiffening member.

Another illustrative embodiment provides for a method of testing electrical equipment through affixing a number of device interface strips to a stiffening member. The stiffening member is then coupled to a test head. A device under test, through an electrically coupled instrument interface block, interfaces with the test head through the circuitry of the device interface strips.

In yet another embodiment, the device interface strips are coupled to the stiffening member through a communication board interconnecting the device interface strips. The backbone of the stiffening member serves as a docking center through which the interface strips may communicate to the test head through a series of electrical contacts. Power may also be distributed from the various utility power supplies to the circuitry on the interface strips. Control signals can also be sent between the device interface strips through a matrix control circuit on the communication board allow for a generic interface bas.

BRIEF DESCRIPTION OF THE DRAWINGS

The foregoing and other features and advantages of the present invention will be more fully understood from the following detailed description of illustrative embodiments, taken in conjunction with the accompanying drawings in which:

FIG. 2A is a top-down view of an arrangement of device interface strips in accordance with one embodiment of the present invention;

FIG. 2B is an enlarged view of a device interface strip in accordance with one embodiment of the present invention;

DETAILED DESCRIPTION

Embodiments of the present invention can provide a reliable and cost effective testing interface for electronic equipment. The modularization of the device interface circuitry greatly eases the interchangeability of instruments as well as drastically reducing cost in the manufacture and design time of automatic test equipment ("ATE"). Various embodiments of the present invention may also reduce the time-to-market by minimizing or eliminating a need to customize test boards, which is typically a very expensive and time consuming effort.

Figure 1:
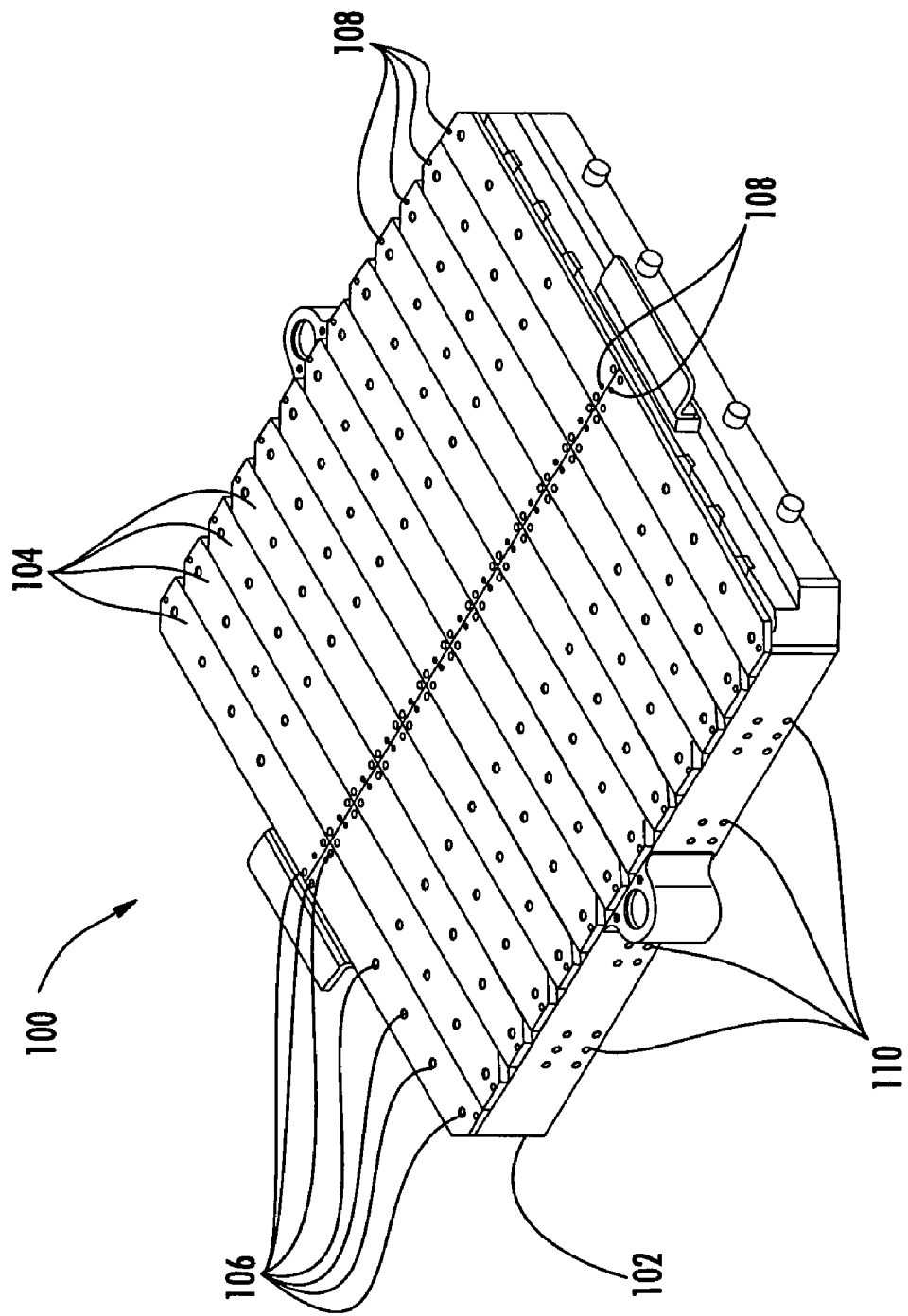
FIG. 1 is a perspective view of the device interface strips mounted on the stiffening member in accordance with an embodiment of the present invention.

Turning now to FIG. 1, a perspective view of one embodiment of a device interface assembly 100 in accordance with the present invention is shown. A stiffening member 102 is shown with device interface strips 104 mounted to the stiffening member 102. In the illustrative example, the sixteen inch by sixteen inch square stiffening member 102 can accommodate twenty-six distinct device interface strips 104. Each device interface strip 104 contains one or more electrical components for signal transmission. Examples of an electrical component can include, without limitation, a trace wire, a loop-back circuit, an integrated circuit, etc. Each device interface strip 104 can contain mounting holes 106 for affixing to the stiffening member 102. The device interface strips 104 contain alignment holes 108 at both ends of the strip to receive the precision alignment pins (not shown) of the stiffening member 102. After the device interface strips 104 are aligned with the alignment holes 108 engaging the precision alignment pins, screws are used to secure the device interface strips 104 to the stiffening member 102. The stiffening member 102 also has frame mounting holes 110 along the outer edge to securely attach the stiffening member 104 to a frame. The frame then securely attaches to the test head.

The device interface strips 104 represent the modularization of the traditional device interface boards common in the art. Traditional ATE probe assemblies required the design, manufacture, and installation of distinct device interface boards for every instrument used and every tested device configuration required. A typical device interface board consists of 20-40 layers of complex printed circuit board technology, requiring substantial cost and time to produce. Embodiments of the present invention can provide for complete modularization of the device interface board. Segmenting the board into strips allows for easy interchangeability and configuration of the probe interface. The individual strips can be interconnected through wires or ribbon cables to maintain intercommunication throughout all the circuits on the strips. Replacement of a testing device requires only a change to the corresponding device interface strip 104 instead of replacing the entire device interface board. The addition, removal or substitution of a device interface strip 104 can be accomplished by the removal of the fastening structure, here six mounting screws, replacing the strip 104 with the desired strip, and re-fastening the mounting screws. Additionally, the manufacture of the device interface strips 104 involves only a fraction of the cost and time of an entire device interface board.

Although the examples explained above detail screw attachments and engagements between the components of the system, one skilled in the art should recognize that any method of securely fastening the components together, e.g. snap fit, clamp fit, button fit, quick-release, etc., does not deviate from the scope of the present invention.

Turning to FIG. 2A, an illustrative layout 200 of the device interface strips 104 is shown in accordance with one embodiment of the present invention. The layout 200 utilizes twenty-six device interface strips 104 with mounting holes 106 along each of the device interface strips 104 and two additional mounting holes 107 located at one end. The two additional mounting holes 107 at the end of the device interface strip 104 affix to a backbone on the stiffening member (not shown). The device interface strips 104 may have alignment holes 108 at both ends to engage alignment pins of the stiffening member. While the illustrated embodiment shows device interface strips with alignment holes centered at the ends of the strip, one skilled in the art should appreciate any alignment pattern or number of mounting holes, such as off-centered alignment holes may be implemented without deviating from the spirit of the invention.

With reference to FIG. 2B, alternative embodiments of device interface strips 104A, 104B are illustrated having at least one conductive edge 105. A device interface strip 104A is illustrated as having two conductive edges, while device interface strip 104B is illustrated as having a single conductive edge. Conductive edges may be formed by a wide variety of methods, such as, but not limited to, plating the edge with copper, nicked or gold. A conductive grounding insert 201 may be placed between two conductive edges to provide an electrically conductive path between neighboring device interface strips 104A, 104B. Examples of conductive grounding inserts can include, but are not limited to, a conductive foil and a flexible corrugated metal sheet or film. In one example, the grounding insert can provide a ground path between neighboring device interface strips.

Figure 3:
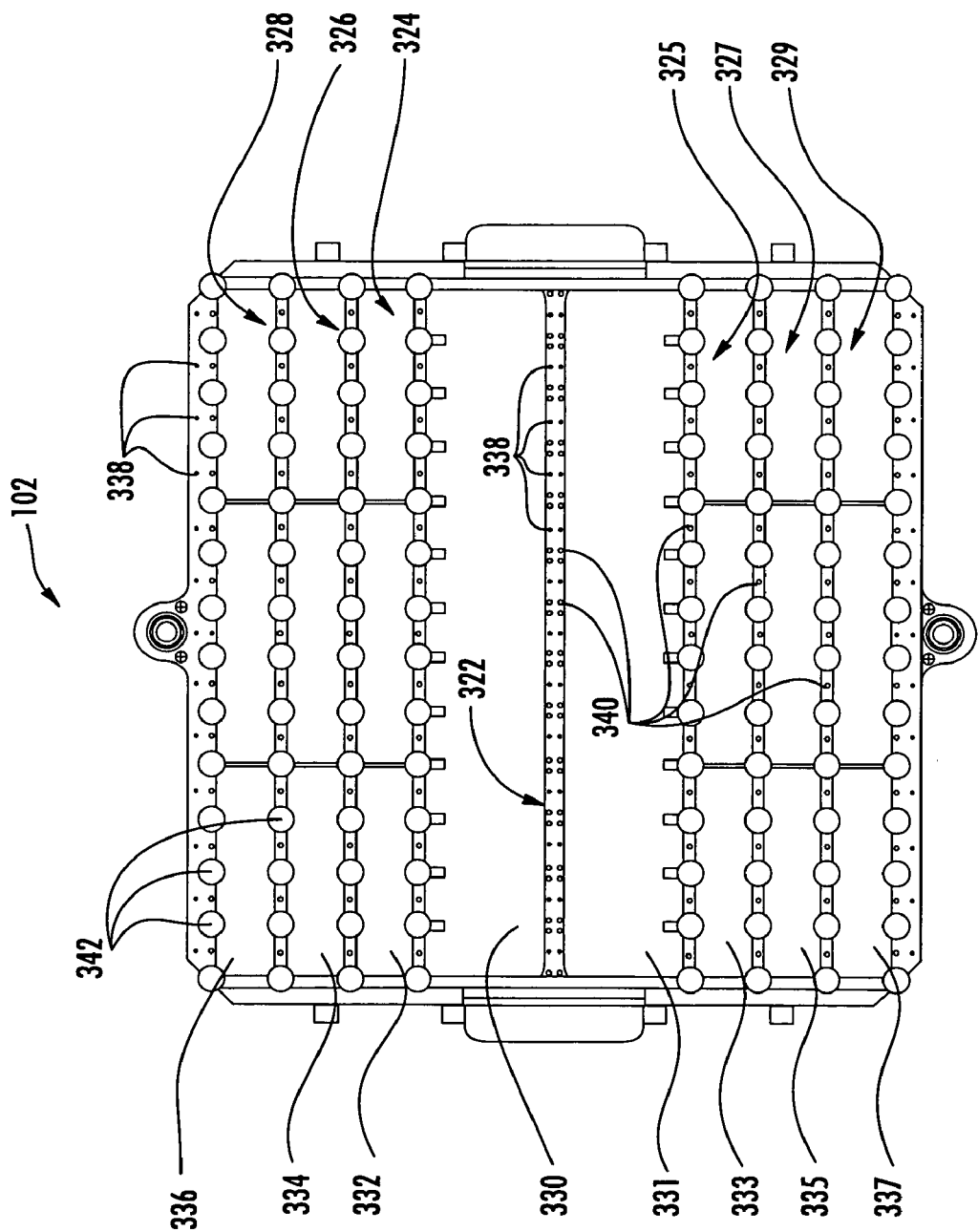
FIG. 3 depicts a top-down view of a stiffening member in accordance with an embodiment of the present invention.

Turning now to FIG. 3, a top-down view of an example of a stiffening member 102 in accordance with one embodiment of the present invention is shown. The stiffening member 102 has a central backbone 322 and a series of ribs 324-329 running parallel to the backbone 322. The backbone 322 is a central mounting point for the device interface strips (not shown). Ribs 324-329 in this embodiment are mounting points and support structures for the device interface strips. The device interface strip may be supported by pads 342 on each rib 324-329 when affixed to the stiffening member 102. The ribs 324-329 of the stiffening member 102 create sidewalks for the segmentation of the signal pads of the device interface circuitry.

The device interface strips are disposed on the stiffening member extending from the backbone 322 to the edge of the stiffening member 102, substantially perpendicular to the backbone 322 and the ribs 324-329. Precision alignment pins 338 are spaced along the top and bottom edges of the stiffening member 102 as well as along the backbone 322. The alignment pins 338 engage the alignment holes of the device interface strips during assembly. The backbone 322 and the ribs 324-329 have screw holes 340 that align with the mounting holes of the device interface strips. Upon assembly the device interface strip is placed over the alignment pins 338 and screws affix the strip to the stiffening member 102 through the mounting holes and screw holes 340.

The stiffening member 102, in this example, is approximately sixteen inches by sixteen inches square with an internal lattice structure creating a series of open passages that may be used to pass wires or locate circuit components. As used herein, the term "sidewalk" is used to refer to each passage row. Sidewalk one 330, 331 is the row defined by the backbone 322 and the first rib 324, 325 to either side of the backbone 322. Sidewalk one 330, 331 is typically reserved for high performance instruments. The circuitry on the device interface strips for these high performance instruments overlaps the area defined as sidewalk one. Sidewalk two 332, 333 is defined by the next outer ribs 326, 327; sidewalk three 334, 335 is defined by the next outer ribs 328, 329; and sidewalk four 336, 337 is defined by the outer ribs 328, 329 and the outer edge of the stiffening member 102. The circuitry of the device interface is designed such that the circuitry of the instruments with the highest performance are disposed closest to the center of the stiffening member 102 and the circuitry of the lowest performance instruments is to the outer sidewalk four 336, 337.

While the embodiments described herein contain a substantially rectangular stiffening member with parallel ribs extending the length of the stiffening member, one skilled in the art should appreciate that any shape, e.g., circular, oval, cross, pentagonal, etc. can be implemented in the form of a stiffening member may be implemented without deviating from the scope of the invention.

Additionally, while the embodiments described herein contain a backbone and ribs that extend the length of the rectangular stiffening member and are substantially parallel to each other, one skilled in the art should recognize that any arrangement of the backbone, e.g., circular ring, rectangular center, etc., and ribs, e.g. radial, non-parallel, skewed, crosshatch, concentric rings, concentric rectangles, etc., may be implemented without deviating from the scope of the invention.

Additionally, while the examples contained herein depict a stiffening member with a single backbone, one skilled in the art should recognize that any number of backbones may be implemented without deviating from the spirit of the present invention.

While the examples explained above depict a sixteen by sixteen inch square, 24 slot stiffening member, one skilled in the art should recognize that using other size stiffening members commonly used in the art would not deviate from the teachings of the present invention.

Figure 4:
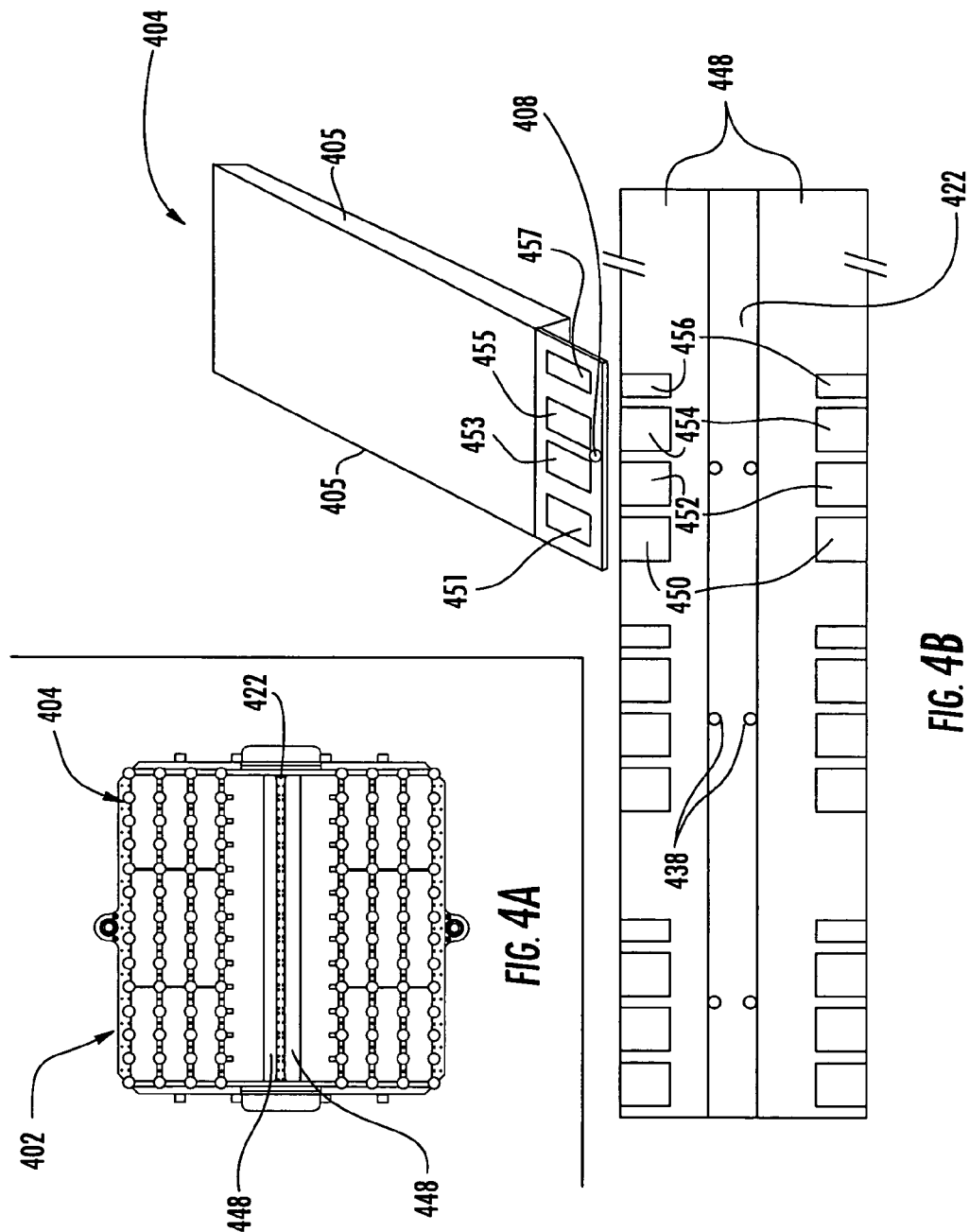
FIG. 4A is a top-down view of a communication board and stiffening member in accordance with one embodiment of the present invention.
FIG. 4B is a depicts an exploded view of a communication board and stiffening member in and accordance with one embodiment of the present invention.

Turning now to FIG. 4A and FIG. 4B, an embodiment of the present invention is shown in which one or more communication boards 448 are provided for communication with one or more device interface strips 404. The communication board can eliminate cumbersome wires attached to the device interface strips 404, while maintaining flexibility of intercommunication with the circuitry between the device interface strips 404. In the present example, the communication board 448 is disposed on both sides of the backbone 422 of the stiffening member. The communication board 448 contains electrical connectors that couple with the connectors of the device interface strip 404. The end of the device interface strip 404 that mounts to the communication board 448 contains a series of electrical connectors connected to the circuitry of the device interface strip 404.

Because the communication board 448 is mounted to the stiffening member, mounting of one end of the device interface strips 404 to the communication board provides a physical mount for one end of the device interface strip. Optionally, the device interface strips 404 can be physically directly mounted to the stiffening member 402, such as at the backbone 422, with additional electrical connectors providing communication with the communication board 448. The device interface strips can contain alignment holes 408 for engagement with the alignment pins 438 on the backbone 422. The stiffening member 402 may be electrically coupled to the test head through the electrical connectors on the backbone 422, such as for grounding and/or for other electrical communications.

While the embodiment depicted in FIG. 4A shows two communication boards 448 on either side of the backbone 422, one skilled in the art should recognize that any number of communication boards may be implemented without deviating from the scope of the present invention, e.g. a single board spanning the backbone or a series of independent or interconnected communication boards disposed along or near the backbone.

In the embodiment shown in FIG. 4B, four distinct busses are implemented into the communication board 448. The communication board 448 has a non-volatile random access memory ("NVRAM") bus 450 for communicating with the NVRAM modules on the device interface strip 404. In the present embodiment, there is one NVRAM per slot available on the stiffening member 402 and a NVRAM located on the communication board (not shown). The communication board 448 also has a utility bus 452 for communication with a transceiver (not shown) located on the device interface strip 404. In this embodiment, four utility data bits ("UDBs") are distributed to each device interface strip 404 through the utility bus 452. The transceiver is controlled by two bits that control whether the transceiver is latching data, reading a support board, or being by-passed. A power bus 454 may be used to provide a connection to utility power supplies. Voltage supplies of 3.3 Volts ("V"), 5 V, 15 A V and 15 B V can be supplied through the power bus 454. Additionally, in this embodiment, an extra bus 456 is provided for possible expansion of any of the circuitry on the device interface board 404. This extra bus 456 is four bits wide and allows slot to slot connectivity between any of the device interface strips 404 attached to the stiffening member. The device interface strip 404 contains a NVRAM bus connector 451, a utility bus connector 453, a power bus connector 455 and an extra bus connector 457 are aligned such that when the device interface strip 404 is attached to the stiffening member, electrical connections are made through the communication board 448. The device interface strip 404 may optionally have one or more conductive edges 405.

Figure 5:
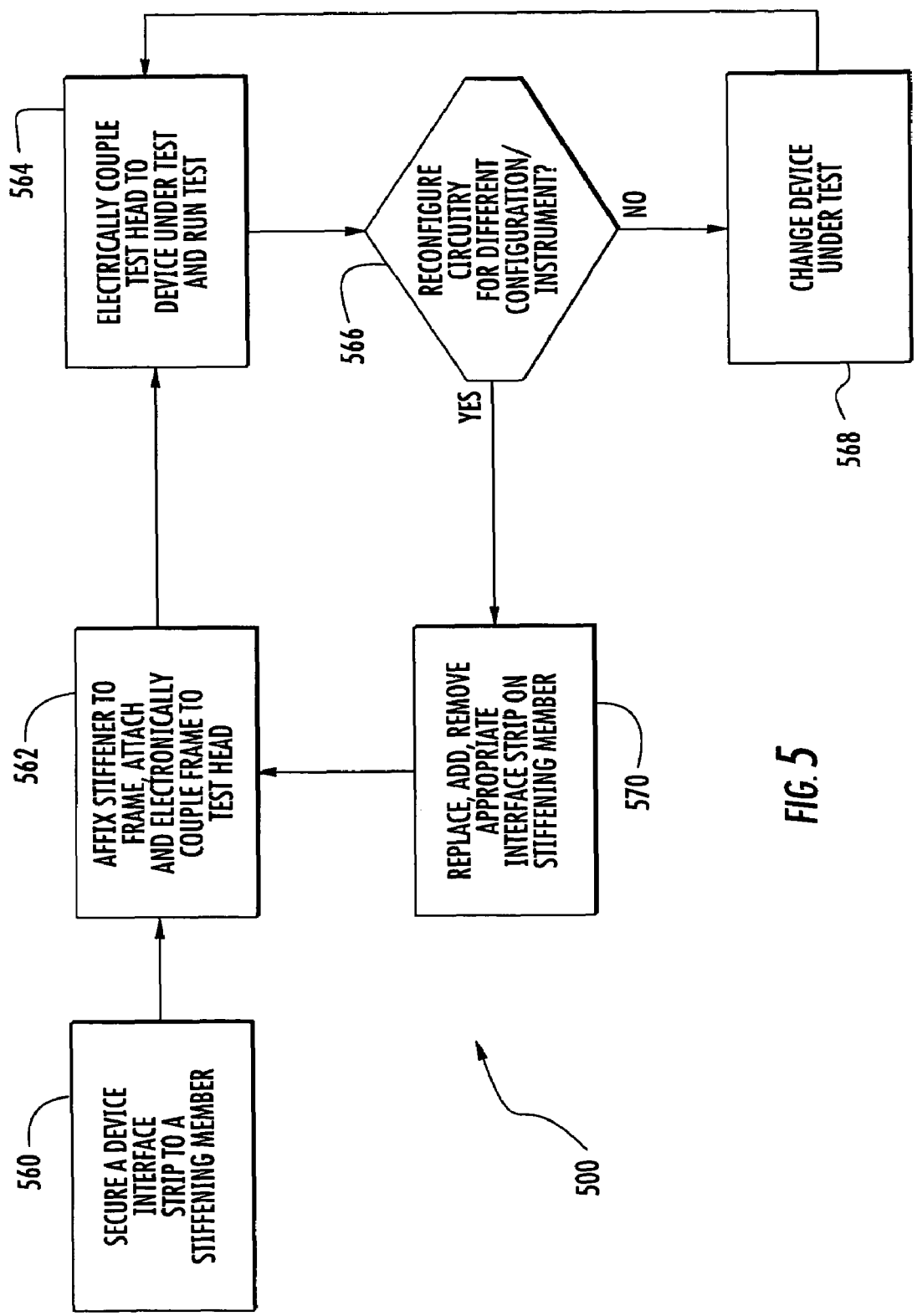
FIG. 5 depicts a flow diagram of a testing process in accordance with an embodiment of the invention.

FIG. 5 shows a method of testing of equipment automatically 500 in accordance with one embodiment of the present invention. The device interface strips are securely affixed 560 to a stiffening member. The stiffening member is then attached 562 to a frame for mounting on a test head. The device interface strips are electronically coupled to the test head and a controller for driving the testing. The device interface strips are then electronically coupled 564 to the instrument interface and the device under test. When electrical connection is made from the test head to the device under test, the specific test is implemented. If the test head or interface circuitry needs to be reconfigured before the next test 566, the appropriate device interface strips can be substituted, added or removed 570. After the configuration changes are made to the device interface circuitry, the stiffening member and frame are re-attached to the test head 562. If no configuration changes are needed after the test is complete, the device under test is changed 568 and the test is run again 564.

The present application incorporates by reference in its entirety, the application entitled Automatic Test Equipment Instrument Card and Probe Cabling System and Apparatus, filed on even date herewith.

In addition to the description of specific, non-limited examples of embodiments of the invention provided herein, it should be appreciated that the invention can be implemented in numerous other applications involving the configurations of ATE. Although the invention is described hereinbefore with respect to illustrative embodiments thereof, it will be appreciated that the foregoing and various other changes, omissions and additions in the form and detail thereof may be made without departing from the spirit and scope of the invention.

What is claimed is:

1. A modularized device interface comprising:
    a stiffening member having a backbone disposed in the stiffening member;
    a plurality of device interface strips disposed on the stiffening member, the plurality of device interface strips extending from the backbone;
    at least one electrical component mounted on each of the plurality of device interface strips, the electrical component containing a circuit network for interfacing an instrument interface block and test head; and
    a grounding insert located between two device interface strips of the plurality of device interface strips, the grounding insert in electrical communication with electrically-conductive edges of the two device interface strips.

2. The modularized device interface of claim 1, wherein the electrical component comprises an electrical trace.

3. The modularized device interface of claim 1, wherein the electrical component comprises an integrated circuit.

4. The modularized device interface of claim 1, wherein the plurality of device interface strips have a first end and a second end, the plurality of device interface trips having an alignment hole at the first end, further comprising:
    alignment pins on the stiffening member, the alignment pins engaging the alignment holes of the first end of each of the plurality of device interface strips.

5. The modularized device interface of claim 1, wherein the backbone comprises a communication board for docking the plurality of device interface strips with a test head, the communication board electrically connecting the plurality of device interface strips.

6. The modularized device interface of claim 1, wherein the stiffening member further comprises at least one rib.

7. The modularized device interface of claim 6, wherein the stiffening member comprises a substantially rectangular frame having a central backbone spanning the stiffening member, the at least one rib spanning the stiffening member.

8. The modularized device interface of claim 1, wherein the electrical component comprises a loop-back circuit.

9. The modularized device interface of claim 1, further comprising wires or ribbon cables coupled to and interconnecting the plurality of device interface strips, thereby maintaining intercommunication throughout the at least one electrical components mounted on each of the plurality of device interface strips.

10. The modularized device interface of claim 1, wherein the grounding insert located between two device interface strips of the plurality of device interface strips is comprised of a flexible corrugated metal sheet.

11. A modularized device interface comprising:
   a stiffening member;
   a plurality of device interface strips disposed on the stiffening member, each device interface strip of the plurality of device interface strips having at least one electrically-conductive edge proximate to a neighboring device interface strip;
   at least one electrical component disposed on each of the plurality of device interface strips, the at least one electrical component comprising a circuitry network adapted for a dedicated functionality to provide an interface between a corresponding testing instrument and a device under test; and
   a grounding insert located between two device interface strips of the plurality of device interface strips the grounding insert in electrical communication with electrically-conductive edges of the two device interface strips.

12. The modularized device interface of claim 11, wherein the electrical component comprises an integrated circuit.

13. The modularized device interface of claim 11, further comprising:
   a communication board mounted to the stiffening member and electrically coupled to at least one electrical component disposed on each device interface strip of the plurality of device interface strips;
   wherein an end of each device interface strip of the plurality of device interface strips is electrically coupled to the communication board.

14. The modularized device interface of claim 11, wherein the grounding insert located between two device interface strips of the plurality of device interface strips is comprised of a flexibly corrugated metal sheet.

* * * * *

UNITED STATES PATENT AND TRADEMARK OFFICE
CERTIFICATE OF CORRECTION

PATENT NO.        : 7,541,819 B2                                                     Page 1 of 1
APPLICATION NO. : 11/261962
DATED             : June 2, 2009
INVENTOR(S)       : Frank B. Parrish, Brian Brecht and Derek Castellano It is certified that error appears in the above-identified patent and that said Letters Patent is hereby corrected as shown below:

Column 6; claim 4, line 54 should read:
Claim 4. The modularized device interface of claim 1, wherein the plurality of device interface strips have a first end and a second end, the plurality of device interface strips having an alignment hole at the first end, further comprising: alignment pins on the stiffening member, the alignment pins engaging the alignment holes of the first end of each of the plurality of device interface strips.

Signed and Sealed this

Tenth Day of November, 2009

David J. Kappos
*Director of the United States Patent and Trademark Office*